United States Patent
Chen et al.

(10) Patent No.: US 10,856,447 B2
(45) Date of Patent: Dec. 1, 2020

(54) HIGH PERFORMANCE OUTDOOR EDGE SERVER

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/246,050

(22) Filed: Jan. 11, 2019

(65) Prior Publication Data
US 2020/0077543 A1    Mar. 5, 2020

Related U.S. Application Data

(60) Provisional application No. 62/723,766, filed on Aug. 28, 2018.

(51) Int. Cl.
*H05K 7/20* (2006.01)
*F28F 3/02* (2006.01)
(Continued)

(52) U.S. Cl.
CPC ........... *H05K 7/20718* (2013.01); *F28F 3/02* (2013.01); *H05K 5/0213* (2013.01); *H05K 5/06* (2013.01);
(Continued)

(58) Field of Classification Search
CPC .... H05K 7/20718; H05K 5/0213; H05K 5/06; H05K 7/20163; H05K 7/20172;
(Continued)

(56) References Cited

U.S. PATENT DOCUMENTS

| | | | | |
|---|---|---|---|---|
| 3,559,728 A | * | 2/1971 | Lyman | H05K 7/206 |
| | | | | 165/55 |
| 5,331,510 A | * | 7/1994 | Ouchi | F28D 15/0275 |
| | | | | 165/104.33 |

(Continued)

FOREIGN PATENT DOCUMENTS

| | | |
|---|---|---|
| EP | 2293658 A2 | 3/2011 |
| JP | 2016057902 A | 4/2016 |

OTHER PUBLICATIONS

Extended European Search Report for EP Application No. 19171370.0, dated Nov. 14, 2019.

(Continued)

*Primary Examiner* — Stephen S Sul
(74) *Attorney, Agent, or Firm* — Nixon Peabody LLP

(57) ABSTRACT

A server includes an inner housing disposed within an outer housing such that a channel is defined between them. The inner housing includes a low-power electronic component and a high-power electronic component, and is sealed to protect the components. A first heat sink extends through the inner housing. Heat generated by the low-power electronic component is transferred through an inner portion of the first heat sink to an outer portion of the first heat sink. A second heat sink disposed in the channel is coupled to the high-power electronic component via heat pipes that extend through the inner housing. Heat generated by the high-power electronic component is transferred through the heat pipes to the second heat sink. A fan positioned in the channel causes air to enter the channel through a first vent, flow through the channel, and exit the channel via a second vent to remove the generated heat.

12 Claims, 4 Drawing Sheets

(51) Int. Cl.
  *H05K 5/02* (2006.01)
  *H05K 5/06* (2006.01)
(52) U.S. Cl.
  CPC ..... *H05K 7/20163* (2013.01); *H05K 7/20172* (2013.01)
(58) Field of Classification Search
  CPC ........... H05K 7/20154; H05K 7/20136; H05K 7/2039; F28F 3/02; G06F 1/20; G06F 1/203; H01L 23/467
  USPC ............... 361/679.47, 679.49, 695, 697, 703
  See application file for complete search history.

(56) References Cited

U.S. PATENT DOCUMENTS

| | | | | |
|---|---|---|---|---|
| 6,396,400 | B1* | 5/2002 | Epstein | G06F 21/86 340/540 |
| 6,459,578 | B1* | 10/2002 | Wagner, III | H05K 7/20145 165/104.33 |
| 7,505,269 | B1* | 3/2009 | Cosley | F28D 15/02 165/104.33 |
| 7,688,584 | B1* | 3/2010 | Becklin | H05K 7/202 165/104.33 |
| 9,781,603 | B1* | 10/2017 | Nenov | G06F 9/45533 |
| 2003/0184973 | A1 | 10/2003 | Nagata et al. | |
| 2006/0087810 | A1* | 4/2006 | Rockenfeller | G06F 1/20 361/679.47 |
| 2011/0075360 | A1* | 3/2011 | Tomioka | G06F 1/20 361/695 |
| 2011/0075366 | A1* | 3/2011 | Tomioka | H05K 7/20336 361/697 |
| 2011/0108250 | A1* | 5/2011 | Horng | G06F 1/28 165/121 |
| 2012/0134114 | A1* | 5/2012 | Kamenszky | H05K 7/202 361/697 |
| 2015/0216090 | A1* | 7/2015 | Sakuma | H05K 7/202 361/697 |
| 2016/0021768 | A1 | 1/2016 | Webster | |
| 2017/0331826 | A1* | 11/2017 | Rodniansky | H04L 63/10 |
| 2018/0011392 | A1* | 1/2018 | Utsunomiya | G03B 21/16 |
| 2018/0042141 | A1* | 2/2018 | Qu | H05K 7/1489 |

OTHER PUBLICATIONS

JP Office Action for Application No. 2019-089935, dated Jul. 7, 2020, w/ First Office Action Summary.

* cited by examiner

HIGH PERFORMANCE OUTDOOR EDGE SERVER

CROSS-REFERENCE TO RELATED APPLICATIONS

This application claims priority to and the benefit of U.S. Provisional Patent Application No. 62/723,766, filed Aug. 28, 2018, which is hereby incorporated by reference herein in its entirety.

TECHNICAL FIELD

The present disclosure relates generally to outdoor servers, and specifically, to removing heat generated by an outdoor server while protecting the it from the environment.

BACKGROUND

High performance servers are often placed in racks within data centers in stable, highly regulated environmental conditions. Because the servers are inside, the servers are protected from rain, wind, dirt, dust, and other environmental conditions that may negatively impact the performance of the servers. Servers in these data centers generally have open housings with vents that allow air to flow through the housing and cool the electronic components inside.

Due to advances such as high speed telecommunications and artificial intelligence, reliable, efficient, and fast communication between data centers and signal sources is vital. To ensure this reliable and fast communication, servers (e.g., edge servers) can be placed between the data center and the signal source. Edge servers can act as an intermediate transmission point along a communication path between a data center and a signal source. However, edge servers often need to be physically located in an outdoor environment (i.e., not contained within a building), and thus cannot be placed in a highly-regulated environment such as a data center. Thus, such located edge servers need to be protected from the outdoor environment, but also need to be cooled so that the electronic components of the edge server do not overheat. The present disclosure is directed to solving these and other problems.

SUMMARY

According to aspects of the present disclosure, an outdoor edge server is provided. The outdoor edge server includes an inner housing and an outer housing. The inner housing contains the electronic components necessary for the edge server to function. The inner housing is substantially watertight and particulate-tight so as to protect the electronic components from wind, rain, dirt, dust, etc., that may be present in the outdoor environment. In order to keep the electronic components cool, the inner housing includes a fan that is configured to circulate the air within the inner housing. This circulating air assists in cooling the electronic components.

The inner housing is disposed partially or completely within the outer housing. The inner housing and the outer housing define an air channel between the inner housing and the outer housing. The outer housing defines air vents at either end of the air channel that allow air to flow into the air channel through a first air vent, through the air channel, and out of the air channel through a second air vent.

The edge server includes one or more heat sinks that are at least partially disposed in the air channel, and located outside of the inner housing but inside the outer housing. A first type of heat sink that can be used has an inner portion that is disposed within the inner housing, and an outer portion that is disposed in the air channel outside of the inner housing. This first heat sink thus extends through the inner housing. However, the interface between the first heat sink and the inner housing is sealed so that the electronic components remain protected from water, dust, dirt, etc. As the air is circulated within the inner housing, the heat that is transferred away from the electronic components can further be transferred to the inner portion of the first heat sink. This heat then travels to the outer portion of the first heat sink such that the heat is transferred away from the interior of the inner housing.

A second type of heat sink that can be used is positioned entirely in the air channel outside of the inner housing. One or more heat pipes extend through the inner housing so as to physically couple the second heat sink to an electronic component within the inner housing. Similar to the first heat sink, the interface between the heat pipes and the inner housing is sealed so that the electronic components remain protected from water, dust, dirt, etc. One end of each heat pipe is generally physically attached to the electronic component, either directly or via a base plate. The other end of each heat pipe is physically attached to the second heat sink so that heat generated by the electronic component is transferred to the second heat sink via the heat pipes.

Because of the direct physical connect, the second type of heat sink is generally used to remove heat from high power electronic components. The first type of heat sink is generally used to remove heat from low power electronic components.

A fan is also positioned within the air channel between the inner housing and the outer housing. The fan is configured to cause air to enter the air channel through one of the air vents and flow through the air channel. As the air flows through the air channel, the air flows past both the outer portion of the first heat sink, and the second heat sink. The flowing air assists in removing the heat that has been transferred to the first heat sink and the second heat sink from the interior of the inner housing. The flowing air then exits the air channel at the second air vent, thus removing the heat from the edge server.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
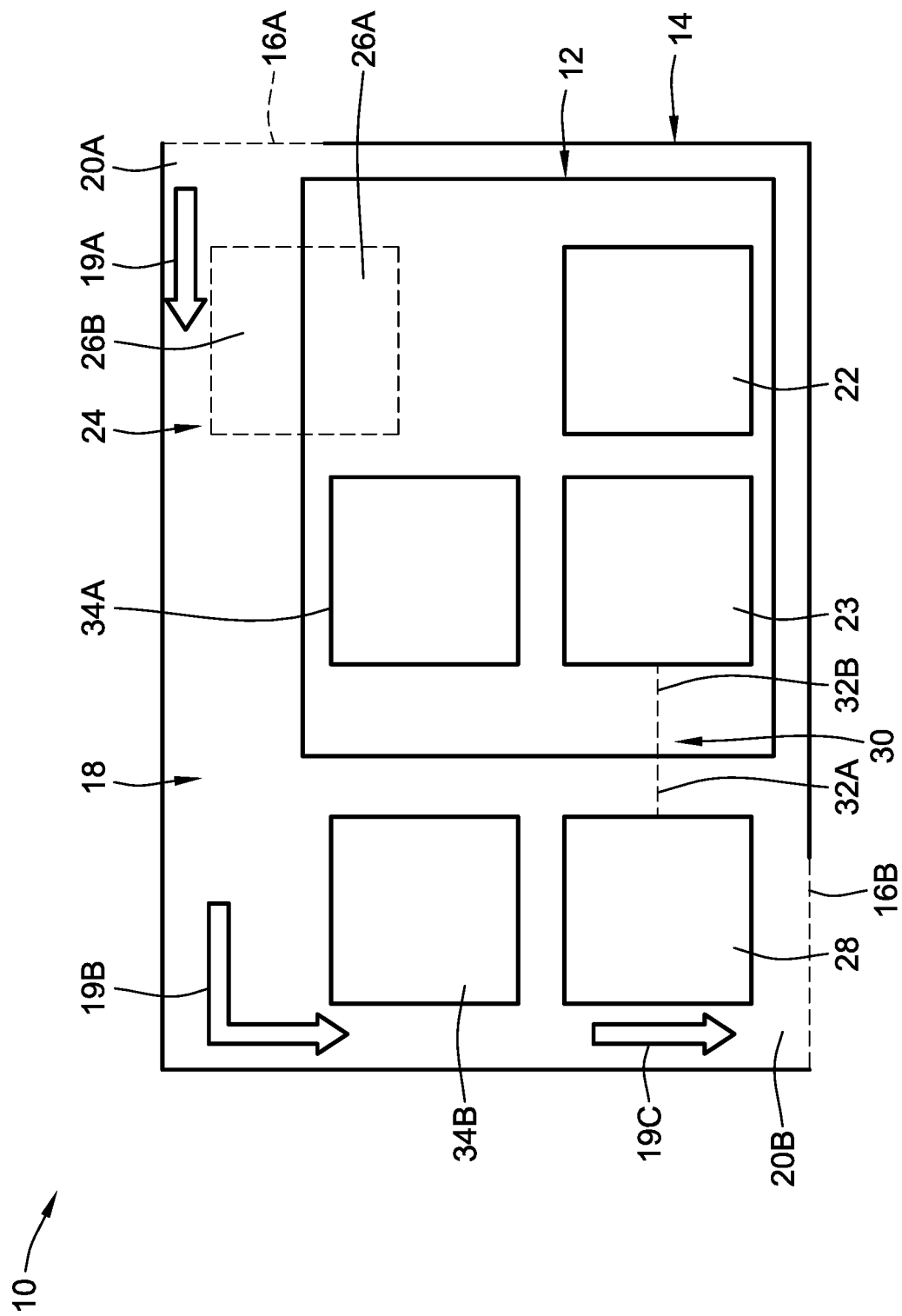
FIG. 1 is a block diagram of a server, according to some aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 shows a block diagram of an edge server 10 that can be located in an outdoor environment and be subject to rain, wind, dust, dirt, etc. The edge server 10 includes an inner housing 12 that is disposed substantially within an outer housing 14. Any electronic components necessary for the edge server 10 to function are located within the inner housing 12. For example, the edge server can include a central processing unit (CPU), a graphics processing unit (GPU), a memory device such as a dual in-line memory module (DIMM), a single in-line memory module (SIMM), a communication module, etc. In the implementation shown in FIG. 1, the inner housing 12 generally includes at least electronic components 22 and 23.

The inner housing 12 is designed to protect the electronic components 22, 23 from being harmed by surrounding environmental conditions. Because the edge server 10 is placed outside, the edge server 10 generally needs to be able to withstand rain, humidity, snow, dirt, dust, and any other potentially negative environmental conditions. Thus, the inner housing 12 is configured so as to generally prevent water, dirt, dust, salt, etc., from entering the inner housing 12 and harming the electronic components 22, 23. In some implementations, the inner housing 12 has at least an IP66 rating. An IP66 rating means that the inner housing 12 generally prevents water and particulates such as dust, dirt, salt, etc., from entering the inner housing 12. Thus, the edge server 10 may be substantially water-tight and particulate-tight, and can be safely placed outside. In other implementations, the inner housing 12 may provide more or less protection, depending on the specific environmental conditions in the area where the edge server 10 is placed.

The electronic components 22, 23 within the inner housing 12 generate heat during operation. In order to cool the inner housing 12 and to help prevent the electronic components 22, 23 from overheating, a first fan 34A is positioned within the inner housing 12. The first fan 34A is configured to circulate air within the inner housing 12, thereby cooling the electronic components 22, 23 within the inner housing 12. However, because the inner housing 12 is substantially water-tight and particulate-tight, the inner housing 12 does not include any vents through which hot air can escape.

The inner housing 12 is disposed partially or completely within the outer housing 14. The inner housing 12 and the outer housing 14 define an air channel 18 that is located within the outer housing 14 and outside of the inner housing 12. A first air vent 16A is defined in the outer housing 14 and is located adjacent to a first end 20A of the air channel 18. A second air vent 16B is defined in the outer housing 14 and is located adjacent to a second end 20B of the air channel 18. The first and second air vents 16A, 16B are open to the environment such that air can flow into the air channel 18 through the first air vent 16A, through the air channel 18, and out of the second air vent 16B. The direction of air flow through the air channel 18 is shown by arrows 19A, 19B, and 19C. Because the inner housing 12 is substantially water-tight and particulate-tight, the electronic components 22, 23 within the inner housing 12 remain protected from the environment, even if any water or particulates enter the air channel 18.

The edge server 10 can include one or more heat sinks that are in thermal exchange with the interior of the inner housing 12 and/or with any of the electronic components 22, 23 positioned within the inner housing 12. The heat sinks thus assist in removing heat from within the inner housing 12. In the implementation shown in FIG. 1, the edge server 10 includes a first heat sink 24 and a second heat sink 28. The first heat sink 24 has an inner portion 26A and an outer portion 26B. The inner portion 26A is disposed within the inner housing 12. The outer portion 26B is disposed in the air channel 18, outside of the inner housing 12 and within the outer housing 14. The first heat sink 24 thus extends through the inner housing 12 and is partially positioned both within the inner housing 12 and outside of the inner housing 12 in the air channel 18. The first heat sink 24 is designed such that the interface between the first heat sink 24 and the inner housing 12 (around the periphery of the first heat sink 24) seals off the interior of the inner housing 12 from the environment. In this manner, the inner housing 12 remains substantially water-tight and particulate-tight, even with the first heat sink 24 extending through the inner housing 12.

In some implementations, the inner portion 26A of the first heat sink 24, the outer portion 26B of the first heat sink 24, and the inner housing 12 are all formed as a single component. In other implementations, the inner portion 26A of the first heat sink 24, the outer portion 26B of the first heat sink 24, and the inner housing 12 are all formed as separate components and then joined together. In still other implementations, the inner portion 26A of the first heat sink 24 and the outer portion 26B of the first heat sink 24 are formed as a single component, and the inner housing 12 is formed as a separate component. The two components can then be joined together by inserting the first heat sink 24 through an aperture in the inner housing 12 and sealing the interface between the first heat sink 24 and the inner housing 12. In still other implementations, the inner housing 12 and one portion of the first heat sink 24 are formed as a single component, and the other portion of the first heat sink 24 is formed as a separate component. The two components can then be joined together.

As the first fan 34A causes the air within the inner housing 12 to circulate, some of the heat generated by the electronic component 22 of the edge server 10 is transferred to the inner portion 26A of the first heat sink 24 that is disposed within the inner housing 12. This heat can then flow to the outer portion 26B of the first heat sink 24, thereby removing the heat from the inner housing 12. The first heat sink 24 thus allows more heat to be removed from the inner housing 12.

The second heat sink 28 is generally of a type known as a remote heat sink. The second heat sink 28 is disposed in the air channel 18 outside of the inner housing 12, but within the outer housing 14. The second heat sink 28 is thermally coupled to the electronic component 23 via one or more heat pipes 30. A first end 32A of each of the heat pipes 30 is positioned outside of the inner housing 12 and is thermally coupled to the second heat sink 28. A second end 32B of the heat pipes 30 is positioned within the inner housing 12 and is thermally coupled to the electronic component 23.

In some implementations, the second ends 32B of the heat pipes 30 are physically attached to the electronic component 23 such that the second ends 32B of the heat pipes 30 are in direct physical contact with the electronic component 23. In other implementations, the second ends 32B of the heat pipes 30 are physically attached to a thermal base plate, which in turn is physically attached to the electronic component 23. In still other implementations, the second end 32B of some or all of the heat pipes 30 can be positioned in close proximity to the electronic component 23 without contacting the electronic component 23. In any of these implementations, heat from the electronic component 23 is transferred to the heat pipes 30.

Similar to the first heat sink 24, the heat pipes 30 extend through the inner housing 12 to the second heat sink 28. The heat pipes 30 are designed such that the interface between the heat pipes 30 and the inner housing 12 (around the periphery of each of the heat pipes 30) seals off the interior of the inner housing 12 from the environment. In this manner, the inner housing 12 remains substantially water-tight and particulate-tight, even with the heat pipes 30 extending through the inner housing 12.

The first end 32A of the heat pipes 30 is thermally coupled to the second heat sink 28, generally via direct physical contact. However, in some implementations, the first end 32A of some or all of the heat pipes 30 can be positioned in close proximity to the second heat sink 28 without contacting the second heat sink 28. The heat pipes 30 thus transfer heat produced by the electronic component 23 out of the inner housing 12 to the second heat sink 28.

A larger amount of heat can be transferred to the second heat sink 28 as compared to the first heat sink 24, due to the heat pipes 30 that connect the electronic component 23 and the second heat sink 28. Thus, the electronic component 23 is generally a high-power electronic component that generates more heat than the electronic component 22, which is generally a low-power electronic component. By using the second heat sink 28 that is in direct or near-direct physical contact with the electronic component 23 via the heat pipes 30, the edge server 10 can utilize high-power electronic components that are operated at full speed and/or capacity. The first heat sink 24 can be used to exchange the heat generated by one or more low-power electronic components, such as the electronic component 22, without needing to implement a more complex remote heat sink with heat pipes such as the second heat sink 28 with heat pipes 30.

In other implementations, the second heat sink 28 has an inner portion disposed within the inner housing 12, and an outer portion disposed within the air channel 18 outside of the inner housing 12, similar to the first heat sink 24. In these implementations, the first ends 32A of the heat pipes 30 are physically attached to the inner portion of the second heat sink 28, and remain disposed entirely within the inner housing 12.

The first heat sink 24 and the second heat sink 28 can be made of any suitable material. For example, the first heat sink 24 and the second heat sink 28 can be made of aluminum, copper, aluminum alloys, copper alloys, or any combinations of these materials.

Due to the presence of both the first heat sink 24 and the second heat sink 28, heat that is generated by the electronic components 22, 23 within the inner housing 12 can be transferred to the exterior of the inner housing 12 without compromising the protection against water and particulates offered by the inner housing 12.

A second fan 34B is also disposed in the air channel 18 between the inner housing 12 and the outer housing 14. In some implementations, the second fan 34B is disposed between the second air vent 16B and the second heat sink 28. In other implementations however, the second fan 34B can be disposed at any location within the air channel 18. The second fan 34B is configured to draw air into the air channel 18 through the first air vent 16A from the outside environment. This air flows through the air channel 18 until it exits the air channel 18 at the second air vent 16B.

As the air flows through the air channel 18, the air flows past the outer portion 26B of the first heat sink 24. The flowing air removes some or all of the heat that has been transferred to the outer portion 26B of the first heat sink 24 from the electronic component 22. The air flowing through the air channel 18 also flows past the second heat sink 28. The flowing air thus also removes some or all of the heat that has been transferred to the second heat sink 28 from the electronic component 23. As the flowing air exits the air channel 18 at the second air vent 16B, the heat generated by the electronic components 22 and 23 is transferred to the exterior of the outer housing 14.

In some implementations, one or both of the outer portion 26B of the first heat sink 24 and the second heat sink 28 includes a plurality of fins. Each fin is generally spaced apart a distance from adjacent fins. As the air flows through the air channel 18, the air can flow through the plurality of fins of the first heat sink 24 and the second heat sink 28, which removes heat more effectively than if the air flows around the first heat sink 24 and the second heat sink 28.

Figure 2:
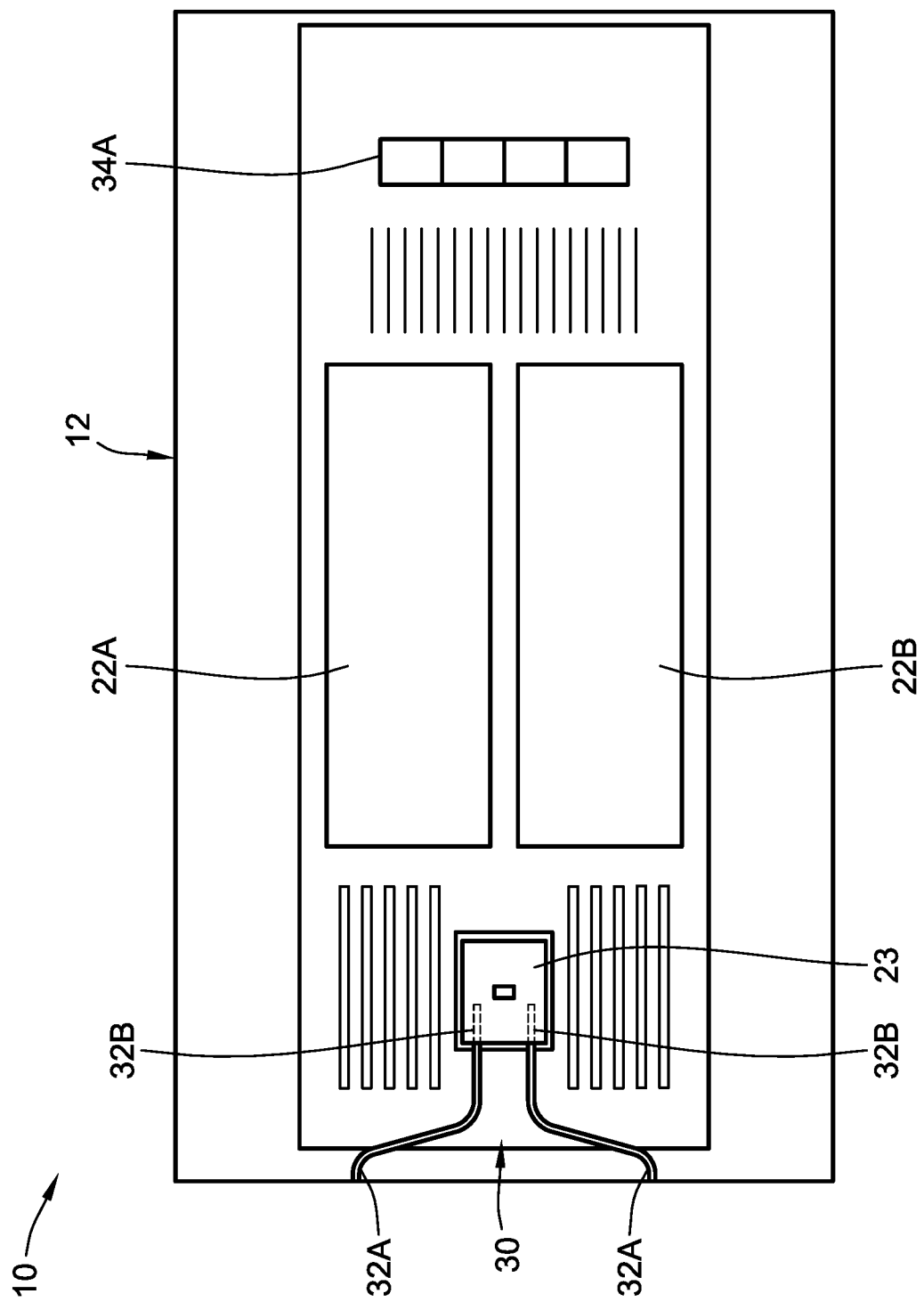
FIG. 2 is a top plan view of an interior of an inner housing of the server of FIG. 1, according to some aspects of the presents disclosure.

FIG. 2 shows a top plan view of the interior of the inner housing 12 in one implementation of the edger sever 10. The inner housing 12 includes two low-power electronic components 22A and 22B, and a high-power electronic component 23. The inner housing 12 also includes the first fan 34A. Other implementations may have these components in a different arrangement. Moreover, other implementations may have a different number of electronic components and/or fans.

The low-power electronic components 22A, 22B generate heat during operation, which heats the surrounding air within the inner housing 12. The first fan 34A is configured to cause this hot air to move away from the low-power electronic components 22A, 22B. The moving hot air forces cooler air that has not yet been heated toward the low-power electronic components 22A, 22B, where it begins to heat up. As the hot air moves away from the low-power electronic components 22A, 22B heat from the hot air is transferred to the inner portion 26A of the first heat sink 24, and subsequently to the outer portion 26B of the first heat sink 24

(FIG. 1). This hot air thus cools down, while the cooler air forced toward the low-power electronic components 22A, 22B heats up. This cycle continues as the first fan 34A constantly causes hot air to move away from the low-power electronic components 22A, 22B and causes cooler air to move towards the low-power electronic components 22A, 22B.

FIG. 2 also shows the heat pipes 30 extending from the high-power electronic component 23. Because the heat pipes are generally physically attached to the high-power electronic component 23, the heat that is generated by the high-power electronic component 23 is transferred to the heat pipes 30, which then transfers this heat out of the inner housing 12. Because of this, the hot air that moves away from the low-power electronic components 22A, 22B is not heated by the high-power electronic component 23, and instead cools down as it moves away from the low-power electronic components 22A, 22B.

Figure 3A:
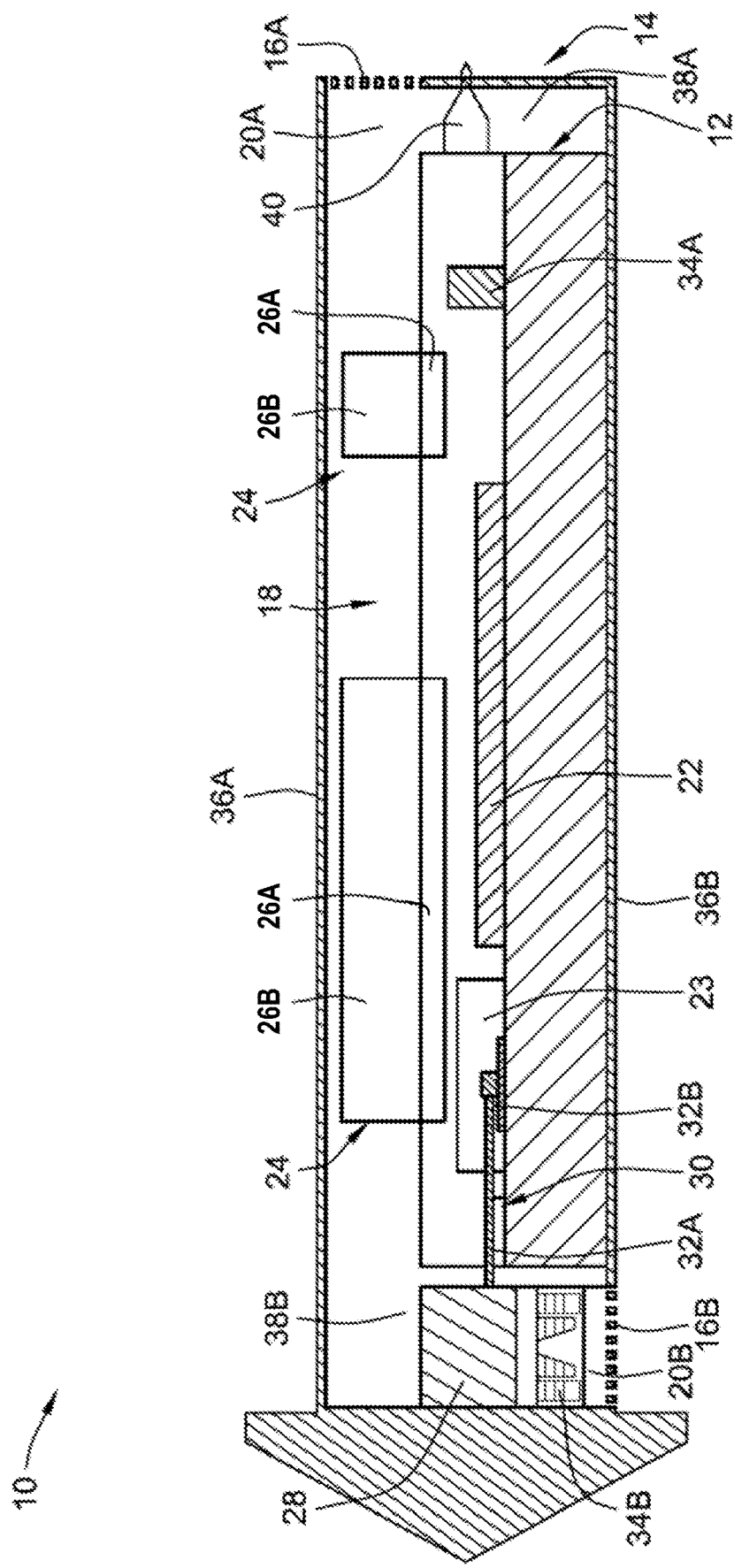
FIG. 3A is a transparent side cross-sectional view of the interior of an implementation of the server of FIG. 1, according to some aspects of the present disclosure.

FIG. 3A shows a transparent side cross-sectional view of one implementation of the edge server 10. In this implementation, the edge server 10 includes multiple first heat sinks 24 that are positioned between a low-power electronic component 22 and a top side 36A of the outer housing 14. The edge server 10 also includes a high-power electronic component 23. As shown, the inner housing 12 is positioned within the outer housing 14 so as to define an air channel 18. In the implementation of FIG. 3A, the inner housing 12 is positioned within the outer housing 14 so as to allow air to flow adjacent to the top side 36A of the outer housing 14, but prevent air from flowing adjacent to a bottom side 36B of the outer housing 14. The flowing air is also prevented from flowing adjacent to a first end 38A of the outer housing 14, and is allowed to flow adjacent to a second end 38B of the outer housing 14.

In some implementations, the inner housing 12 prevents the air from flowing adjacent to the first end 38A of the outer housing 14. In the implementation illustrated in FIG. 3A, a blocking component 40 is positioned between the inner housing 12 and the outer housing 14 to prevent air from flowing adjacent to the first end 38A of the outer housing 14. The air channel 18, as shown in FIG. 3A, thus has an L-shape. In other implementations, however, the air channel 18 could have a generally linear shape, a U-shape, a curved shape, an irregular shape, or any other suitable shape.

The first air vent 16A is disposed in the outer housing 14 at the first end 20A of the air channel 18. The second air vent 16B is disposed in the outer housing at the second end 20B of the air channel 18. The second fan 34B is disposed in the air channel 18 to cause air to enter the air channel 18 through the first air vent 16A, and exit the air channel 18 through the second air vent 16B.

The edge server 10 in FIG. 3A includes two different first heat sinks 24. The inner portion 26A of each first heat sink 24 is disposed within the inner housing 12, while the outer portion 26B of each first heat sink 24 is disposed outside of the inner housing 12 in the air channel 18. The first fan 34A positioned within the inner housing 12 assists in transferring heat generated by the low-power electronic component 22 to the inner portions 26A of the first heat sinks 24. The second heat sink 28 is also disposed outside of the inner housing 12 in the air channel 18. A first end 32A of each of the heat pipes 30 is positioned outside of the inner housing 12 and is thermally coupled to the second heat sink 28. A second end 32B of the heat pipes 30 is positioned within the inner housing 12 and is thermally coupled to the high-power electronic component 23 to thereby transfer heat generated by the high-power electronic component 23 out of the inner housing 12 to the second heat sink 28.

As the air flows through the air channel 18, the air flows through and/or past the outer portion 26B of the first heat sink 24, as well as the second heat sink 28. The heat that is transferred to the outer portion 26B of the first heat sink 24 and the second heat sink 28 is thus removed by the flowing air, which transfers the heat out of the outer housing 14 as the air exits the air channel 18.

Figure 3B:
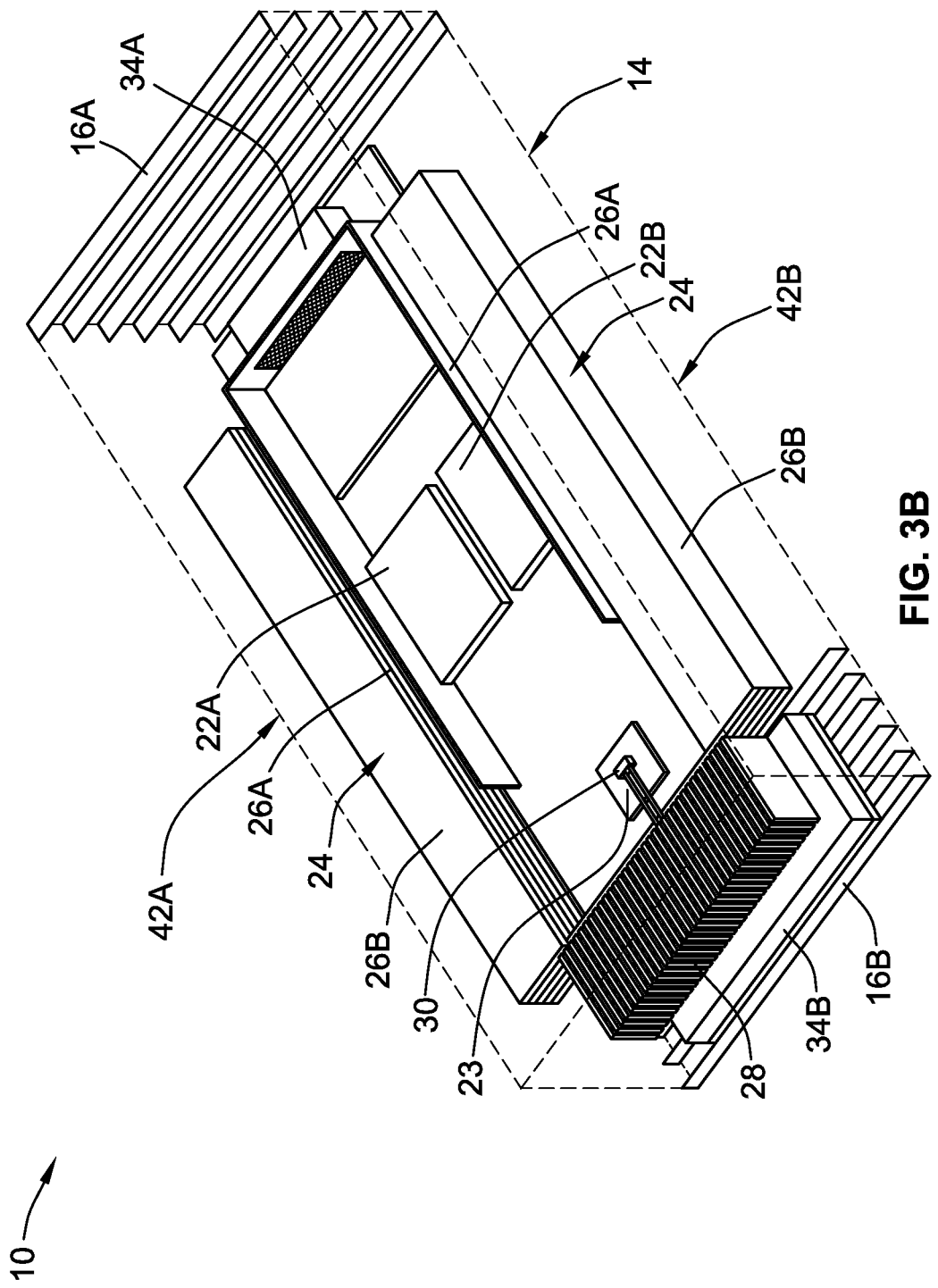
FIG. 3B is a transparent perspective view of the interior of another implementation of the server of FIG. 1, according to some aspects of the present disclosure.

FIG. 3B shows a transparent perspective view of another implementation of the edge server 10. In this implementation, the edge server 10 includes multiple first heat sinks 24 that are positioned between the low-power electronic components 22A, 22B and the lateral sides 42A, 42B of the outer housing 14. As shown in FIG. 3B, the low-power electronic components 22A, 22B are disposed in an inner housing (not shown), along with high-power electronic component 23. Each of the first heat sinks 24 have an inner portion 26A positioned within the interior of the inner housing, and an outer portion 26B positioned exterior to the inner housing within the air channel. The edge server 10 in FIG. 3B also includes a first fan 34A positioned within the inner housing, and a second fan 34B positioned in the air channel along with a second heat sink 28. First and second air vents 16A and 16B in the inner housing 12 are also provided so as to allow air to flow through the outer housing 14.

Other implementations of the edge server 10 can have a different number of components and in a different arrangement as compared to the implementations illustrated in FIGS. 3A and 3B. For example, the air channel 18 can have any suitable shape, or the outer housing 14 may have more than two air vents 16A, 16B defined in the outer housing 14.

The edge server 10 illustrated in FIGS. 1-3B can generally include any number or type of heat sinks, depending on the specific needs of the server. For example, an edge server 10 could include both a first heat sink 24 positioned above the low-power electronic component 22A as shown in FIG. 3A, and one or more first heat sinks 24 positioned to the sides of the low-power electronic components 22A, 22B as shown in FIG. 3B. In another example, different edge servers 10 may have different numbers of low-power electronic components and high-power electronic components. Any number of first heat sinks 24 and second heat sinks 28 can be used to satisfy the needs of any specific edge server 10.

Heat sinks such as the second heat sink 28 are often used for high-power components that generate large amounts of heat. In some implementations, high-power components are components that consume about 100 Watts or more of energy. Because of the direct physical contact between these heat sinks and the high-power electronic components via the heat pipes, these types of heat sinks are generally better-equipped for removing the heat generating by high-power components.

Heat sinks such as the first heat sink 24 that gather heat due to the air circulation within the inner housing 12 can be used for lower-power components that do not generate as much heat as high-power components. In some implementations, low-power components are components that consume about 100 Watts or less of energy.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An high performance outdoor edge server comprising:
   an outer housing exposed to an outdoor environment, the outer housing defining a first air vent and a second air vent, the first air vent configured to draw gasses and entrained particulates from an outdoor environment into the outer housing, and the second air vent configured to exhaust the gasses from the outer housing back into the outdoor environment;
   an inner housing configured as a water-tight enclosure without any vents, the inner housing disposed within the outer housing such that an air channel is defined between the inner housing and the outer housing, the air channel having a first end and a second end, the first air vent being positioned adjacent to the first end of the air channel and the second air vent being positioned adjacent to the second end of the air channel;
   at least one high heat generating electronic component positioned completely within the inner housing;
   at least a second heat sink positioned completely within the air channel;
   at least one heat pipe extending through the inner housing so as to thermally couple the at least second heat sink to the at least one high heat generating electronic component such that the second heat sink is in thermal exchange with the at least one high heat generating electronic component in the inner housing;
   at least one low heat generating electronic component positioned completely within the inner housing, the at least one low heat generating electronic component generating less heat than the at least one high heat generating electronic component;
   at least one first heat sink, the at least one first heat sink configured to comprise an inner portion disposed within the inner housing and an outer portion that is disposed within the air channel outside of the inner housing;
   a first fan positioned within the inner housing, the first fan configured to circulate air solely within the inner housing, the first fan circulating air over at least the one low heat generating electronic component thereby removing heat therefrom and thereby cooling the at least one low heat generating electronic component positioned within the inner housing and creating a current of heated air; and circulating the current of heated air into contact with the inner portion of the at least one first heat sink to transfer heat from the current of heated air to the at least one first heat sink;
   a second fan positioned and configured to cause air to enter the air channel via the first air vent, flow through at least a portion of the air channel, and through at least the outer portion of the at least one first heat sink and, thereafter, over the at least one second heat sink, and exit the air channel via the second air vent,
   wherein the inner housing is sealed from the air that enters the air channel caused by the second fan.

2. The high performance outdoor edge server of claim 1, wherein a first end of the at least one heat pipe is thermally coupled to the second heat sink and a second end of the at least one heat pipe is in physical contact with a thermal base plate, which thermal base plate is in physical contact with the at least one high heat generating electronic component such that heat generated by the at least one high heat generating electronic component is transferred through the at least one heat pipe to the second heat sink.

3. The high performance outdoor edge server of claim 2, wherein the second fan is disposed in the air channel and aids in removing the portion of the heat transferred to the air channel out of the outer housing.

4. The high performance outdoor edge server of claim 2, wherein the first end of the at least one heat pipe is in proximity to the second heat sink to thermally couple the at least one heat pipe to the second heat sink.

5. The high performance outdoor edge server of claim 1, wherein the inner housing is substantially sealed.

6. The high performance outdoor edge server of claim 5, wherein the inner housing is substantially sealed to aid in preventing water and dust particulates from entering the inner housing.

7. The high performance outdoor edge server of claim 1, wherein a first end of the at least one heat pipe is thermally coupled to the second heat sink and a second end of the at least one heat pipe is physically coupled to the at least one high heat generating electronic component such that heat generated by the at least one high heat generating electronic component is transferred through the at least one heat pipe to the second heat sink.

8. The high performance outdoor edge server of claim 7, wherein the first end of the at least one heat pipe is in proximity to the second heat sink to thermally couple the at least one heat pipe to the second heat sink.

9. The high performance outdoor edge server of claim 1, wherein an interface of the at least one heat pipe extending through the inner housing seals the inner housing from the environment.

10. The high performance outdoor edge server of claim 9, wherein a first end of the at least one heat pipe is thermally coupled to the second heat sink, and wherein a second end of the at least one heat pipe is in close proximity to the at least one high heat generating electronic component, such that heat generated by the at least one high heat generating electronic component is transferred through the at least one heat pipe to the second heat sink.

11. The high performance outdoor edge server of claim 1, wherein the second heat sink includes a plurality of fins positioned in the air channel.

12. The high performance outdoor edge server of claim 11, wherein the air flowing through the air channel flows through the plurality of fins of the second heat sink to remove heat from the second heat sink.

\* \* \* \* \*